United States Patent

Nagahata et al.

Patent Number: 5,335,002
Date of Patent: Aug. 2, 1994

[54] PRINTING HEAD AND PRINTER INCORPORATING THE SAME

[75] Inventors: Takaya Nagahata; Toshiyuki Shirasaki; Hiroshi Fukumoto; Tokihiko Kishimoto; Masayoshi Yamaguchi; Yoshinori Matsumoto, all of Kyoto; Hisato Matsumoto; Yoshihiro Ishizaki, both of Amagi; Yoshinobu Kishimoto, Kyoto, all of Japan

[73] Assignee: Rohm Co., Ltd., Kyoto, Japan

[21] Appl. No.: 950,651

[22] Filed: Sep. 23, 1992

[30] Foreign Application Priority Data

Sep. 30, 1991 [JP] Japan ................................. 3-252060
Sep. 30, 1991 [JP] Japan ................................. 3-252061
Jan. 31, 1992 [JP] Japan ................................. 4-16547
Feb. 14, 1992 [JP] Japan ................................. 4-27623

[51] Int. Cl.⁵ .............................. B41J 2/34; B41J 2/335
[52] U.S. Cl. ............................................ 346/76 PH
[58] Field of Search ................................ 346/76 PH

[56] References Cited

U.S. PATENT DOCUMENTS 4,963,886  10/1990  Fukuda et al. ............. 346/76 PH

FOREIGN PATENT DOCUMENTS 349959   1/1990  European Pat. Off. .
433865   6/1991  European Pat. Off. .
435699   7/1991  European Pat. Off. .
3909286  9/1990  Fed. Rep. of Germany .
2-3343   1/1990  Japan .
2-108561 4/1990  Japan .
2-94131  7/1990  Japan .
88/07729 10/1988 PCT Int'l Appl. .

Primary Examiner—Benjamin R. Fuller
Assistant Examiner—Huan Tran
Attorney, Agent, or Firm—William H. Eilberg

[57] ABSTRACT

A printing head comprises an elongate head substrate provided with a line of printing dots along a first longitudinal edge of the substrate, and an array of drive IC's provided on the head substrate along a second longitudinal edge of the substrate. The substrate is further provided with a plurality of connection terminals adjacent to the second longitudinal edge. The drive IC array is rendered shorter than the printing dot line to provide two excess portions at both ends of the head substrate, and the connection terminals are locally arranged within the respective excess end portions without overlapping the drive IC array longitudinally of the head substrate.

15 Claims, 15 Drawing Sheets

PRINTING HEAD AND PRINTER INCORPORATING THE SAME

BACKGROUND OF THE INVENTION

1. Field of the Invention

This invention relates generally to printing heads which include thermal printing heads and LED printing heads for example. More particularly, the present invention relates to a line-type printing head in which connection terminals used for electrical connection to an external control circuit are arranged only locally of the head. The present invention also relates to a printer incorporating such a printing head.

2. Description of the Prior Art

As is well known, a typical line-type thermal printing head comprises an elongate head substrate which is provided with a line of heating dots along a first longitudinal edge (one longitudinal edge) of the substrate, and an array of drive IC's along a second longitudinal edge (the other longitudinal edge) of the substrate for driving the heating dots. The head substrate is also provided with comb-like connection terminals adjacent to the second longitudinal edge of the substrate for receiving power supply and various signals from an external control circuit. A wiring conductor pattern is formed on the substrate for electrically connecting the connection terminals to the respective drive IC's.

The head substrate is usually attached on a rigid support plate which functions also as a heat sink. A connector board (often referred to as "flexible board") is mounted on the support plate to partially overlap the head substrate. The connector board, which is also formed with a wiring conductor pattern, has comb-like connection terminals in corresponding relation to the connection terminals of the head substrate for connection to the external control circuit.

Further, a presser cover substantially equal in length to the head substrate is fixed on the support plate for pressing the connection terminals of the flexible connector board into intimate electrical contact with the connection terminals of the head substrate. Fixation of the presser cover is usually established by screws spaced suitably along the entire length of the support plate.

The conventional line-type thermal head having the above-described structure is known to have the following disadvantages.

First, the provision of the presser cover inevitably increases the thickness of the thermal head. Thus, it is difficult to realize a sufficient size reduction required for recent facsimile machines and printers.

Secondly, a problem of thermal bending occurs in the conventional thermal due to the so-called "bimetal phenomenon", thereby seriously deteriorating the printing quality. The bimetal phenomenon is caused by difference in linear thermal expansion between the support plate and the presser cover because the support plate receives heat immediately from the head substrate while the presser cover receives heat from the support plate indirectly through the screws with a time lag.

U.S. Pat. No. 4,963,886 to Fukuda et al. discloses an improved line-type thermal printing head wherein connection terminals are arranged locally only in a limited central portion of a head substrate which is attached on a support plate, and a flexible connector board is correspondingly reduced in length. Due to such a structure, a presser cover needs only to press the connector board only in the limited central portion of the head substrate, and both ends of the presser cover are made to move longitudinally of the head substrate. Thus, even if the support plate and the presser cover are linearly expanded to different degrees, the thermal head can be prevented from thermally bending to the bimetal phenomenon.

However, the prior art thermal head disclosed in the above U.S. patent still has the following disadvantages.

First, the prior art thermal head retains the basic structure wherein the flexible connector board is pressed against the head substrate by the presser cover. Thus, the provision of the presser cover increases the overall thickness of the thermal head.

Secondly, since the connection terminals of the head substrate are arranged in the limited central portion of the substrate, a common electrode for the heating dot line must have a pair of leg portions extending from both ends of the head substrate to the central portion thereof. Thus, the overall length of the common electrode becomes inevitably large to increase voltage drop along the common electrode, consequently giving adverse influences on the printing quality. The problem of voltage drop is particularly significant because the common electrode must pass a relatively large current.

In the third place, because of the central arrangement, the connection terminals of the head substrate need be located in a strip-like portion between a drive IC array and a longitudinal edge of the head substrate. Further, the leg portions of the common electrode must extend in the same strip-like portion of the head substrate. Thus, the width of the strip-like portion need be sufficiently increased to enable formation of the connection terminals and the common electrode leg portions together with a wiring conductor pattern for connecting the connection terminals to the drive IC array. As a result, the width of the head substrate must be inevitably increased in spite of the requirement for a size reduction.

SUMMARY OF THE INVENTION

It is, therefore, an object of the present invention to provide a printing head which can be reduced both in width and thickness.

Another object of the present invention is to provide a preferred printer which incorporates such a printing head.

A further object of the present invention is to provide a drive IC which can be advantageously incorporated into such a printing head.

According to one aspect of the present invention, there is provided a printing head comprising: an elongate head substrate having first and second longitudinal edges; a line of printing dots provided on the head substrate along the first longitudinal edge; an array of drive IC's provided on the head substrate along the second longitudinal edge; a plurality of connection terminals formed on the head substrate adjacent to the second longitudinal edge; and a pattern of wiring conductor paths formed on the head substrate for electrically connecting between the connection terminals and the drive IC's; wherein the drive IC array is rendered shorter than the printing dot line to provide an excess portion at one end of the head substrate, the connection terminals being locally arranged within the excess end portion without overlapping the drive IC array longitudinally of the head substrate.

According to another aspect of the present invention, there is provided a printing head comprising: an elongate head substrate having first and second longitudinal edges; a line of printing dots provided on the head substrate along the first longitudinal edge; an array of drive IC's provided on the head substrate along the second longitudinal edge; a plurality of connection terminals formed on the head substrate adjacent to the second longitudinal edge; and a pattern of wiring conductor paths formed on the head substrate for electrically connecting between the connection terminals and the drive IC's; wherein the drive IC array is rendered shorter than the printing dot line to provide two excess portions at both ends of the head substrate, the connection terminals being locally arranged within the respective excess end portions without overlapping the drive IC array longitudinally of the head substrate.

The present invention also provides a printer incorporating the above-described printing head. Specifically, the printer further comprises a control circuit board arranged adjacent to the head substrate, the control circuit board being provided with connection terminals electrically connected to the connection terminals of the head substrate.

Moreover, the printer may additionally comprise a printer main body and a pivotal member pivotally connected to the main body. The head substrate together with the control circuit board may be fixedly supported by the main body, and the head substrate may be held in pressing contact with a platen which is supported by the pivotal member and urged toward the head substrate by spring means. Alternatively, the head substrate together with the control circuit board may be supported by the pivotal member, and the head substrate urged by spring means may be held in pressing contact with a platen which is supported by the printer main body.

Other objects, features and advantages of the present invention will become apparent from the following detailed description of the preferred embodiments given with reference to the accompanying drawings.

DETAILED DESCRIPTION OF THE PREFERRED EMBODIMENT

Figure 1:
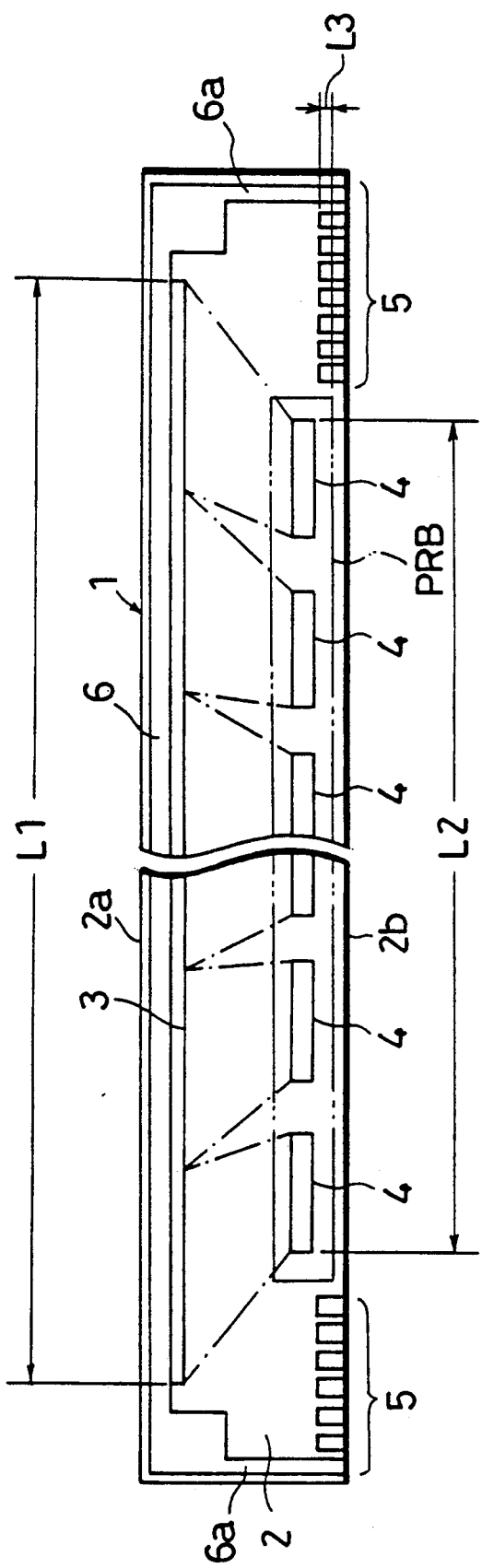
FIG. 1 is a schematic plan view showing a printing head embodying the present invention.

Referring first to FIG. 1 of the accompanying drawings, a thermal printing head is shown as an embodiment of the present invention. However, the present invention is equally applicable to an LED printing head or other printing head.

The thermal head generally indicated by reference numeral 1 includes an elongate head substrate 2 which is made of an insulating material such as ceramic. The head substrate 2 has a first longitudinal edge 2a and a second longitudinal edge 2b.

The head substrate 2 has an upper surface formed with a heating resistor line 3 extending longitudinally of the substrate along the first longitudinal edge 2a, and an array of drive IC's 4 also extending longitudinally of the substrate along the second longitudinal edge 2b. The resistor line 3, which may be made of a thick film, is divisionally heated by the drive IC's 4 to provide a line of heating dots (printing dots), and each drive IC corresponds to a group which contains a predetermined number of heating dots. The array of drive IC's 4 is enclosed in a protective resin body PRB.

The upper surface of the head substrate 2 is also formed with two groups of connection terminals 5 arranged in respective end portions of the substrate adjacent to the second longitudinal edge 2b. The upper surface of the head substrate is further formed with a common electrode 6 extending longitudinally of the substrate between the first longitudinal edge 2a and the resistor line 3. Each end 6a of the common electrode 6 extends transversely toward the second longitudinal edge 2b to provide a connection terminal in the corresponding terminal group 5.

In accordance of the teaching of the present invention, the heating resistor line 3 has a length L1, and the array of drive IC's 4 is intentionally arranged in a smaller length L2, as shown in FIG. 1. In this way, two excess spaces are formed at the respective end portions of the head substrate 2 without increasing the length of the substrate 2 itself, and the respective groups of connection terminals 5 are arranged locally by utilizing these excess spaces. Thus, the respective groups of connection terminals 5 do not overlap the array of drive IC's 4 longitudinally of the substrate 2.

On the other hand, the respective groups of connection terminals 5 overlap the protective resin body PRB for the array of drive IC's 4 transversely of the head substrate 2 by an amount L3. Such a transverse overlap, which is effective for reducing the width of the substrate 2, is possible because the respective groups of connection terminals do not overlap the array of drive IC's 4 in the longitudinal direction of the substrate 2, as described above.

Figure 2:
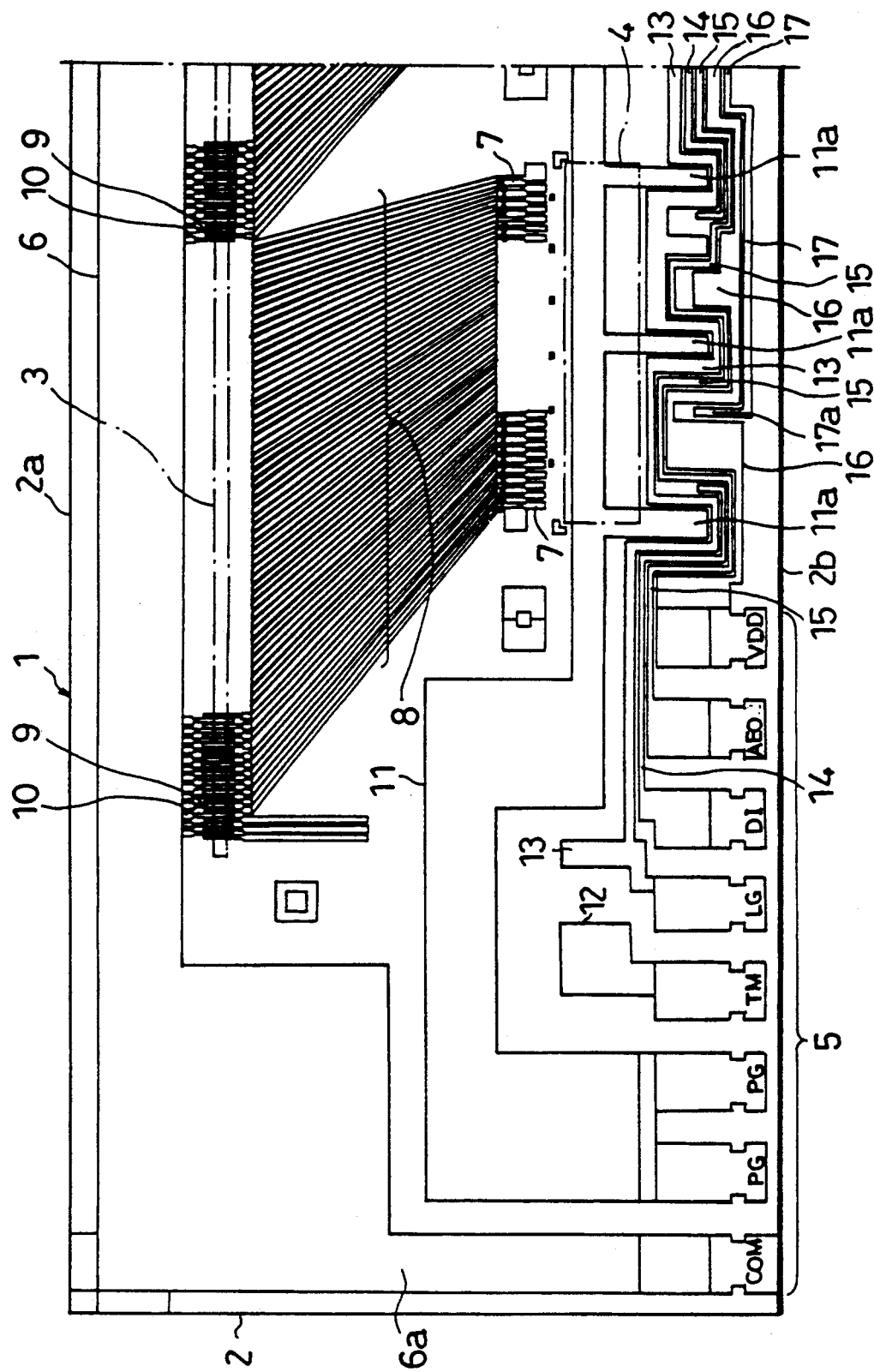
FIG. 2 is a fragmentary plan view showing a left-hand end portion of the printing head.
Figure 3:
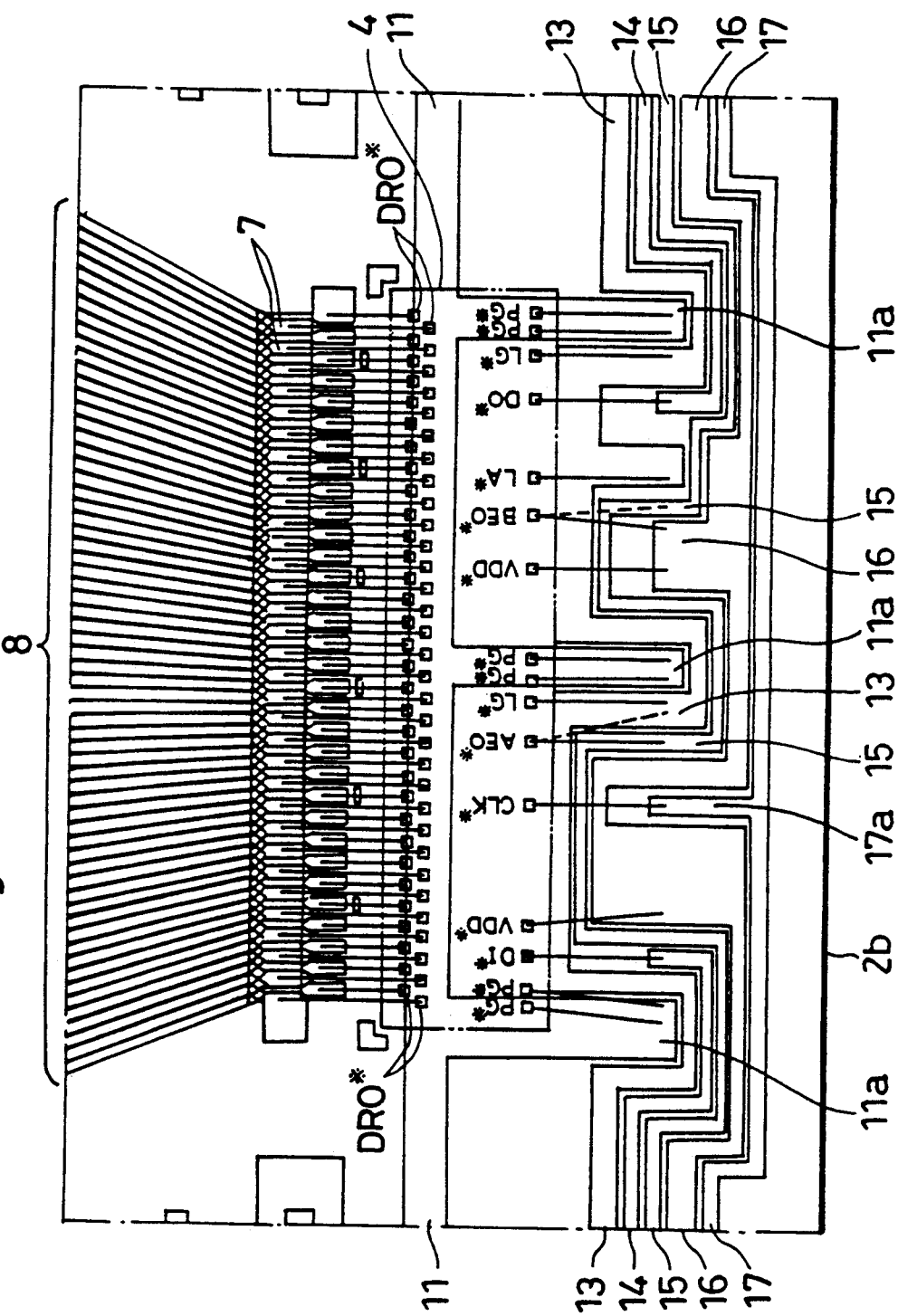
FIG. 3 is a fragmentary plan view showing a central portion of the same head.
Figure 4:
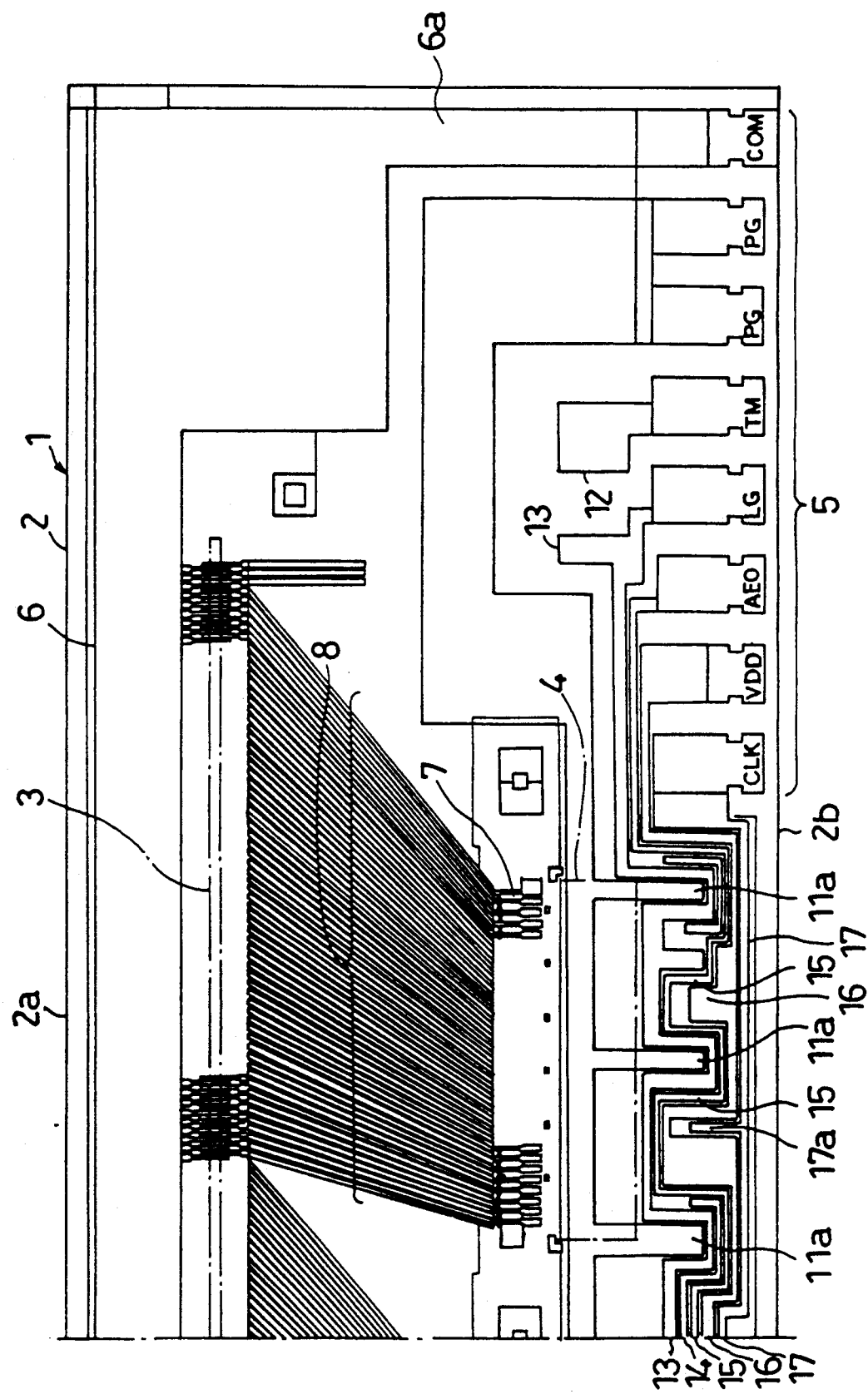
FIG. 4 is a fragmentary plan view showing a right-hand end portion of the same head.

The details of the thermal head 1 or head substrate 2 are illustrated in FIGS. 2-4. FIGS. 2 and 4 shows the left- and right-hand end portions, respectively, of the substrate 2, whereas FIG. 3 shows the central portion of the same.

As shown in FIGS. 2-4, groups of wire bonding pads 7 are formed on the upper surface of the head substrate 2 adjacent to the respective drive IC's 4 on the side thereof closer to the first longitudinal edge 2a. A multiplicity of individual electrodes 8 extend, in a slightly flaring pattern, from the respective groups of wire bonding pads 7 to a first series of comb-like teeth 9 crossing the heating resistor line 3. A second series of comb-like teeth 10, which also cross the resistor line 3, are arranged in staggered relation to the first series of comb-like teeth 9 and connected to the common electrode 6. Thus, the heating dots are provided by the respective portions of the resistor line 3 between the two kinds of comb-like teeth 9, 10.

The heating dots provided by the resistor line 3 are divided into different groups corresponding to the respective drive IC's 4. As clearly appreciated from FIGS. 2-4, the central drive IC is longitudinally aligned with the central heating dot group (see FIG. 3), whereas the remaining drive IC's are longitudinally offset toward the center of the head substrate 2 relative to the corresponding heating dot groups (see FIGS. 2 and 4). The degree of longitudinal offset increases progressively toward the respective ends of the drive IC array. It is such a longitudinal offset that makes the length L2 of the drive IC array smaller than the length L1 of the resistor line 3.

As shown in FIG. 2, the group of connection terminals 5 located in the left-hand end portion of the head substrate 2 include, from left to right, a common terminal COM, two power grounding terminals PG, a thermistor connection terminal TM, a logic grounding terminal LG, a data-in terminal DI, a strobe terminal AEO, and a logic power supply terminal VDD. The two power grounding terminals PG are necessary for enabling passage of a sufficient current. These power grounding terminals PG may merge with each other.

As shown in FIG. 4, the group of connection terminals 5 located in the right-hand end portion of the head substrate 2 include, from right to left, a common terminal COM, two power grounding terminals PG, a thermistor connection terminal TM, a logic grounding terminal LG, a strobe terminal AEO, a logic power supply terminal terminal VDD and a clock terminal CLK.

Each common terminal COM is provided by the corresponding end portion 6a of the common electrode 6, as previously described. Each power grounding terminal PG is connected to a power grounding conductor path 11 which extends longitudinally of the head substrate 2 under the respective drive IC's 4. The power grounding conductor path 11 has branching portions 11a extending toward the second longitudinal edge 2b of the substrate at the respective drive IC's 4. In the illustrated embodiment, three such branching portions are assigned to each drive IC.

Each thermistor connection terminal TM is connected to a thermistor mounting pad 12 located close to that terminal. A thermistor (not shown) mounted on the pad 12 is used to monitor the temperature of the thermal head.

A logic grounding conductor path 13 connected to each logic grounding terminal LG, a data conductor path 14 connected to the data-in terminal DI, a strobe conductor path 15 connected to each strobe terminal AEO, and a logic power supply conductor path 16 connected to each logic power supply terminal VDD extend longitudinally of the substrate 2 in parallel to each other. However, these conductor paths 13-16 are formed in a bent or zigzag pattern for circumventing the branching portions 11a of the power grounding conductor path 11 and for conveniently wire-bonding to the respective drive IC's 4.

It should be appreciated that the data conductor path 14 is rendered discontinuous at the positions of the respective drive IC's 4. Instead, the data conductor path 14 is connected in series or cascade with the respective drive IC's 4, as more clearly described hereinafter. Thus, the data signals are supplied successively through the array of drive IC's 4 from the single data-in terminal DI. The data conductor path 14 may be connected to a data-out terminal (not shown) though such a terminal may be omitted as in the illustrated embodiment.

The single clock terminal CLK (FIG. 4) located in the right-hand end portion of the head substrate 2 is connected to a clock conductor path 17 which extends longitudinally of the substrate 2 slightly in a bent pattern along with the conductor paths 13-16 and terminates at the left end drive IC 4. The clock conductor path 17 has branching portions 17a at the respective drive IC's 4 for conveniently wire-bonding thereto.

As represented in FIG. 3, each drive IC 4 has a multiplicity of drive output pads DRO* arranged in two rows adjacent to one longitudinal edge of the drive IC. These output pads are connected to the wire bonding pads 7 of the corresponding individual electrodes 8 by wire-bonding.

As also illustrated in FIG. 3, each drive IC further has a plurality of additional pads (including control signal pads) arranged adjacent to the other longitudinal edge of the drive IC. These additional pads include, from left to right, two power grounding pads PG*, a data-in pad DI*, a logic power supply pad VDD*, a clock pad CLK*, a negative logic strobe pad AEO*, a logic grounding pad LG*, two additional power grounding pads PG*, another logic power supply pad VDD*, a positive logic strobe pad BEO*, a latch pad LA*, a data-out pad DO*, another logic grounding pad LG*, and two further power grounding pads PG*. These additional pads are connected to the relevant conductor paths 11-17 by wire-bonding, as follows.

The six power grounding pads PG* of each drive IC 4 are wire-bonded to the power grounding conductor path 11. Similarly, the two logic grounding pads LG* are wire-bonded to the logic grounding conductor path 13, whereas the two logic power supply pads VDD* are wire-bonded to the logic power supply conductor path 16. Further, the single clock pad CLK* is wire-bonded to the clock conductor path 17, whereas the single latch pad LA* is wire-bonded to the logic grounding conductor path 13. It should be appreciated that the logic grounding pads LG* and the latch pad LA* are connected to the same logic grounding conductor path 13 because no latch signal is separately supplied. Of course, the latch pad LA* may be connected to a latch signal conductor path (not shown) if latch signals are separately supplied.

As previously described, the data conductor path 14 is rendered discontinuous because the respective drive IC's 4 are connected in cascade by the data conductor path. Thus, the data-in and data-out pads DI*, DO* of each drive IC 4 are wire-bonded to the data conductor path 14 at the point of discontinuity.

When each drive IC 4 is controlled by negative logic strobe signals, the negative logic strobe pad AEO* is wire-bonded to the strobe conductor path 15 while the positive logic strobe pad BEO* is wire-bonded to the logic power supply conductor path 16, as indicated by solid wire lines in FIG. 3. On the other hand, when the drive IC is controlled by positive logic strobe signals, the negative logic strobe pad AEO* is wire-bonded to the logic grounding conductor path 13 while the positive logic strobe pad BEO* is wire-bonded to the strobe conductor path 15, as indicated by broken wire lines in FIG. 3. For facilitating such selection of wire-bonding, the logic grounding conductor path 13, the strobe conductor path 15 and the logic power supply conductor path 16 are made to have their respective wire bonding portions (namely, the portions extending transversely of the substrate 2) located adjacent to each other.

According to the illustrated embodiment, all of the conductor paths 11, 13–17 are formed substantially in a repetitive pattern with respect to all of the drive IC's 4, as shown in FIGS. 2–4. Such a repetitive conductor path pattern is advantageous at least for the following reasons.

First, the length L1 of the heating resistor line 3, i.e., the effective printing width of the thermal head, may be easily altered by simply changing the number of repetitions (namely, the number of drive IC's 4) with respect to the conductor paths 11, 13–17 without changing the path pattern itself. Thus, the design change is kept minimum.

Secondly, due to the repetitive nature of the conductor path pattern, the wire-bonding relative to the conductor paths 11, 13–17 is also repetitive for all drive IC's 4. Thus, inspection of the wire-bonding condition, either visual or automatic (by using an industrial television), can be performed very efficiently.

As previously described, the length L2 of the drive IC array 4 is reduced to be smaller than the length L1 of the heating resistor line 3, thereby providing excess mounting spaces at both ends of the head substrate 2 without increasing the overall length of the substrate itself. Thus, the two groups of connection terminals 5 can be located in the respective excess end portions of the head substrate 2. Such an arrangement is advantageous in the following points.

First, since the connection terminals 5 do not overlap the drive IC array 4 longitudinally of the head substrate the connection terminals 5 may be made to overlap the protective resin body PRB transversely of the substrate, as represented by L3 in FIG. 1. Such a transverse overlap reduces the width of the substrate. Because the connection terminals 5 need be entirely exposed for connection to an unillustrated control circuit, the protective resin body PRB must not transversely overlap the connection terminals 5 if the connection terminals 5 are located between the drive IC array 4 and the second longitudinal edge 2b of the substrate.

Secondly, a strip-like portion between the drive IC array and the second longitudinal edge 2b of the head substrate 2 may be entirely used for arranging the conductor paths 13–17. Thus, even if this strip-like portion is narrow (as required for reducing the width of the substrate), the space limitation poses no serious difficulty in forming the conductor paths 13–17.

In the third place, because the two groups of connection terminals 5 are arranged in the excess end portions of the head substrate, the respective ends 6a of the common electrode 6 can immediately join the connection terminals. If the connection terminals 5 are arranged in a longitudinally central portion of the head substrate 2, the common electrode 6 must additionally have two leg portions extending toward the center of the substrate along the second longitudinal edge 2b thereof, consequently resulting in a significant voltage drop.

In the illustrated embodiment, further, the conductor paths 11, 13, 15–17 are connected commonly to all of the drive IC's 4 while the data conductor path 14 connects all of the drive IC's 4 in cascade. Thus, the number of the connection terminals 5 associated with these conductor paths 11, 13–17 can be sufficiently reduced on the head substrate 2 itself.

If a realizable reduction in the total number of connection terminals is insufficient, it is necessary to use a separate connector board for further reducing the number of connection terminals before connection to a control circuit, as disclosed in U.S. Pat. No. 4,963,886. Further, the use of such a connector board then makes it necessary to use a separate presser cover for pressing the connector board into intimate contact with the head substrate. Thus, the overall thickness of the thermal head increases inevitably due to the presence of the connector board and presser cover.

In the illustrated embodiment of the present invention, on the other hand, no separate connector board need be provided because the total number of connection terminals 5 is already reduced sufficiently on the head substrate 2 itself. As a result, the overall thickness of the thermal head 1 can be greatly reduced at least due to the absence of a connector board and a presser cover associated therewith.

According to the illustrated embodiment, the connection terminals 5 are arranged in the respective excess end portions of the head substrate 2. However, these connection terminals may be arranged only in one end portion of the substrate.

Figure 5:
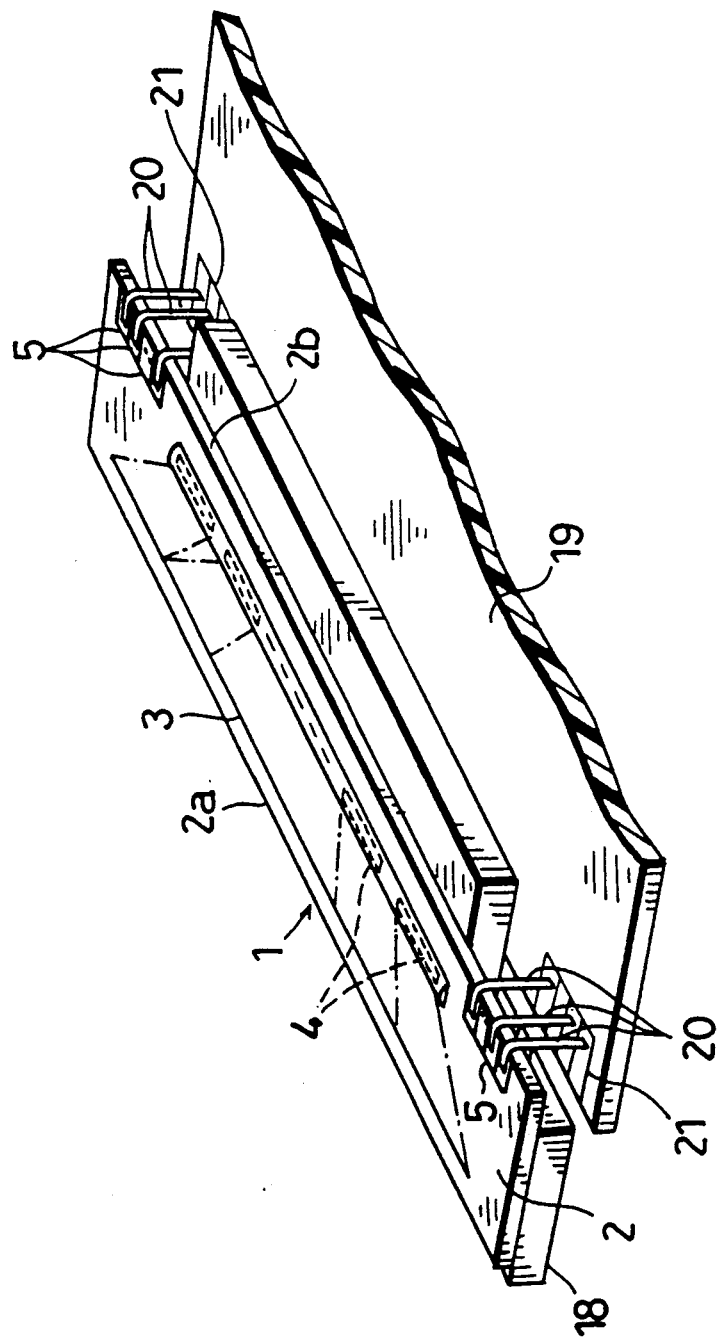
FIG. 5 is a perspective view showing an example of connecting the same head to a control circuit board.

In assembly, the head substrate 2 may be mounted on a support plate 18 which is made of a metallic material such as iron or aluminum, as shown in FIG. 5. The support plate 18 serves as a heat sink in addition to reinforcing the substrate which is relatively brittle. The support plate 18 may be a part which is preassembled with the head substrate 2 by a thermal head manufacturer before shipment to a printer manufacturer. Alternatively, the support plate 18 may be a part of a printer prepared by a printer manufacturer (or facsimile machine manufacturer), and the head substrate 2 supplied separately by a thermal head manufacture may be mounted on the support plate 18 at the time of assembling the printer (or facsimile machine).

Preferably, the head substrate 2 is adhesively bonded to the support plate 18 only at a longitudinally central portion of the substrate. Thus, the respective end portions of the substrate 2 is longitudinally movable relative to the support plate 18. As a result, the thermal head 1 is prevented from thermally bending due to the so-called "bimetal phenomenon" which would be caused by the difference in thermal expansion between the substrate 2 and the support plate 18.

As also illustrated in FIG. 5, the connection terminals 5 located in the respective end portions of the head substrate 2 are electrically connected to a control circuit board 19 only by means of short clip-type leads 20. The control circuit board 19 carries two groups of connection terminals 21. Since no separate connector board is arranged between the substrate 2 and the control circuit board 19, the connection terminals 21 of the control circuit board 19 corresponds in position and number to the connection terminals 5 of the substrate 2.

Each of the short clip-type leads 20 has a clip end held in clipping engagement with the second longitudinal edge 2b of the substrate 2 for facilitating subsequent electrical connection to the corresponding connection terminal 5 of the substrate by soldering for example. The other end of the clip-type lead 20 may be electrically connected to the corresponding connection terminal 21 of the control circuit board 19 by soldering for example.

As previously described, the thermal head 1 requires no separate connector board for electrical connection to the control circuit board 19. Thus, the control circuit board 19 may be positioned very close to the head substrate 2 for compact arrangement, and the short leads 20 can be conveniently used to establish electrical connection between the substrate 2 and the control circuit board 19. Further, such close positioning and the use of the short leads 20 are also advantageous in reducing noises which may be caused by the use of high-frequency signals for the purpose of controlling or driving the thermal head.

Figure 6:
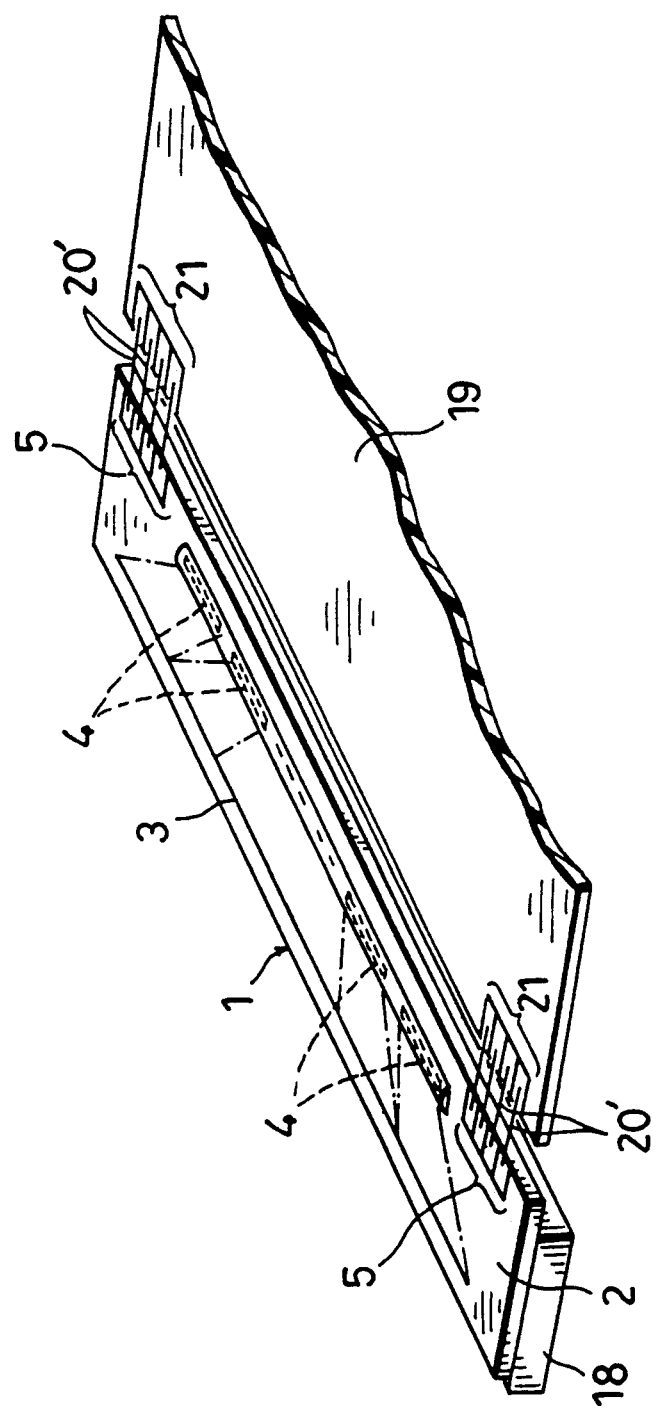
FIG. 6 is a perspective view showing another example of connecting the same head to a control circuit board.

As shown in FIG. 6, the head substrate 2 may be electrically connected to the control circuit board 19 by means of short non-clip-type leads 20'. The respective leads 20' are soldered to the corresponding connection terminals 5, 21 of the substrate 2 and control circuit board 19.

Figure 7:
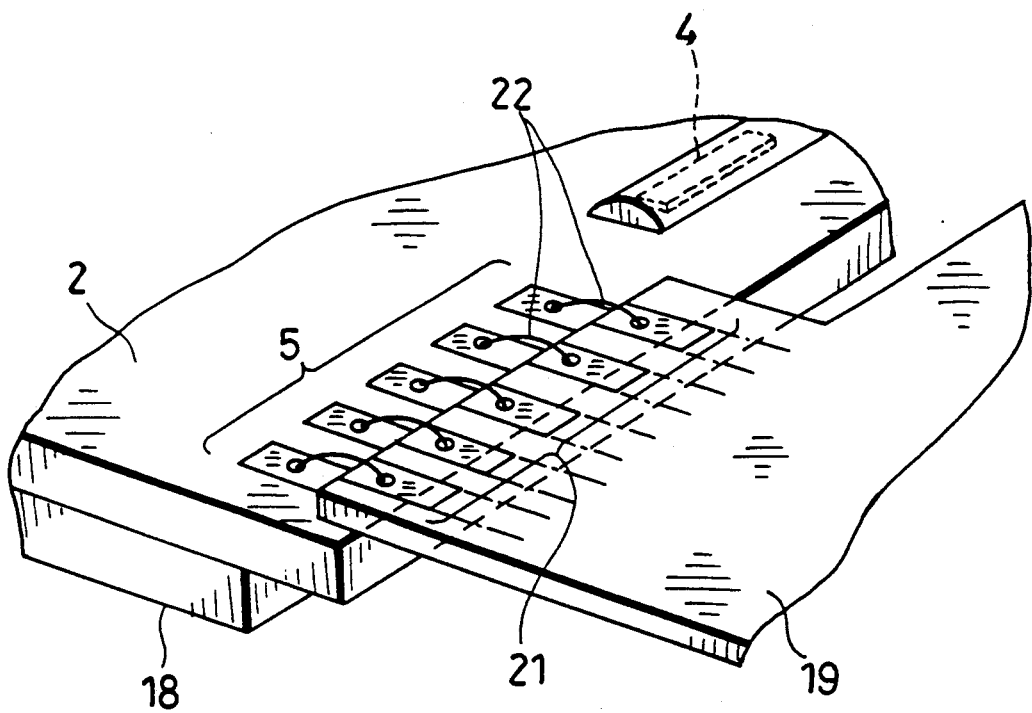
FIG. 7 is a perspective view showing a further example of connecting the same head to a control circuit board.

Alternatively, the control circuit board 19 may be overlapped partially on the head substrate 2, as shown in FIG. 7. The connection terminals 5 of the substrate 2 are electrically connected to the corresponding connection terminals 21 of the control circuit board 19 through bonding wires 22.

Figure 8:
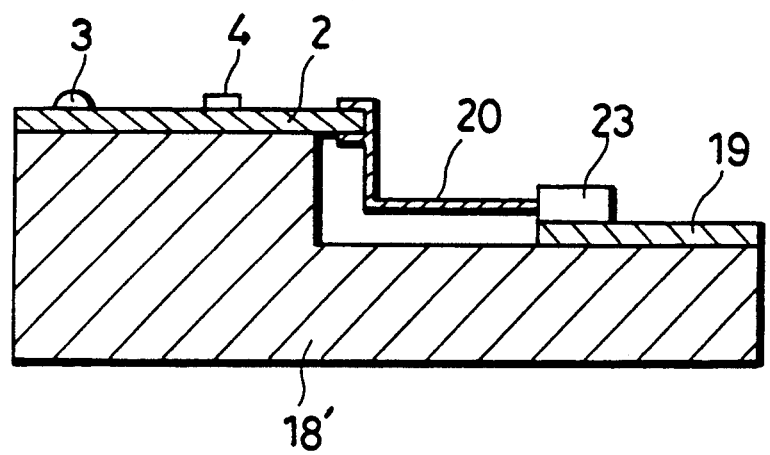
FIG. 8 is a sectional view showing still another example of connecting the same head to a control circuit board.

As shown in FIG. 8, use may be made of a support plate 18' for supporting both of the head substrate 2 and the control circuit board 19. In this embodiment, electrical connection between the substrate 2 and the control circuit board 19 is established by short clip-type leads 20 (only one shown) and a pair of insertion-type connectors 23 (only one shown). Specifically, each connector 23 is carried on the control circuit 19 in electrical conduction therewith, and each lead 20 with its clip end engaging the substrate 2 is inserted into a corresponding hole of the connector 23.

According to the arrangement of FIG. 8, electrical connection between the leads 20 and the connector 23 can be more conveniently established than directly connecting the leads 20 to the control circuit board 19 by soldering. Further, since the leads 20 are positionally adjustable relative to the connector 23 within a predetermined tolerance, such positional adjustability can be utilized for positionally adjusting the head substrate 2 (namely, the heating resistor line 3) relative to the unillustrated platen. Moreover, the substrate 2 and the control circuit board 19 are separately replaceable when one of these components is damaged.

Figure 9:
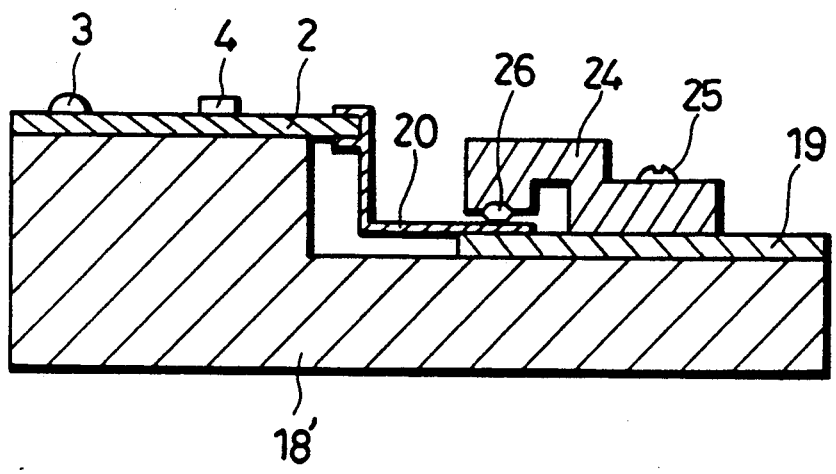
FIG. 9 is a sectional view showing a further example of connecting the same head to a control circuit board.

Alternatively, the clip-type leads 20 may be electrically connected to the control circuit board 19 by using a presser member 24, as shown in FIG. 9. The presser member 24 may be removably fixed to the support plate 18' by screws 25, and the underside of the presser member 24 is provided with a rubber rod 26 for pressing the leads 20 into intimate contact with the control circuit board. Obviously, the arrangement of FIG. 9 has substantially the same advantages as that of FIG. 8.

FIGS. 10–14 show various printers according to the present invention. In these drawings, only principal parts are shown, and a paper feed mechanism and other related mechanisms are omitted for the convenience of illustration.

Figure 10:
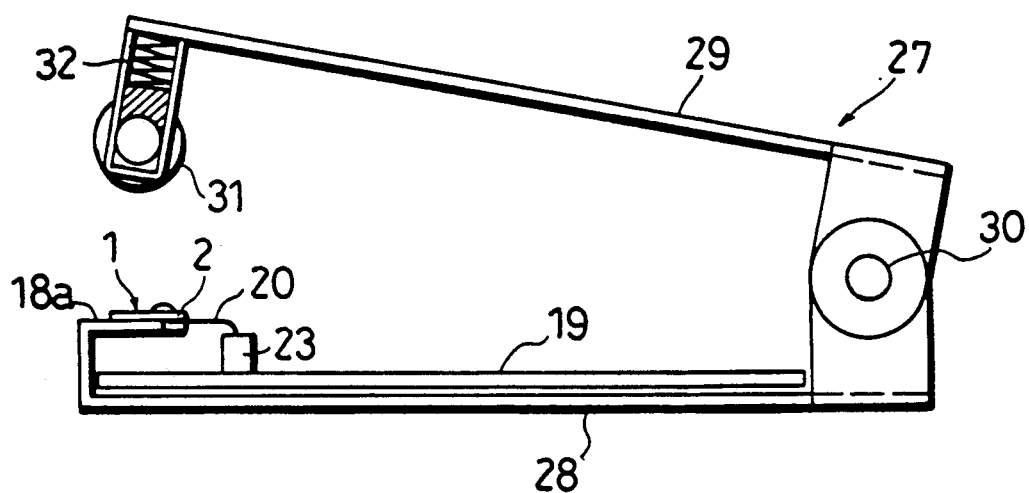
FIG. 10 is a schematic side view showing a printer according to the present invention.

In FIG. 10, a printer generally designated by reference numeral 27 is shown to comprise a main body 28 and a pivotal member 29 connected to the main body 28 by means of a hinge device 30. The main body 28 has a bent front end to provide an integral support plate 18a for supporting a head substrate 2 of the above-described structure. The substrate 2 may be adhesively attached, only at a longitudinally central portion, to the support plate 18a, as previously described.

The main body 28 also supports a control circuit board 19 which carries a pair of connectors 23. A plurality of short clip-type leads 20 are inserted into the respective connectors 23, and the clip ends of the respective leads 20 are soldered to the substrate 2, thereby establishing electrical connection between the substrate 2 and the control circuit board 19.

On the other hand, the pivotal member 29 of the printer 27 carries a platen 31 which is downwardly urged by compression springs 32. When the pivotal member 29 is pivoted to the closed position, the platen 31 is brought into uniform pressing contact with the head substrate 2.

Figure 11:
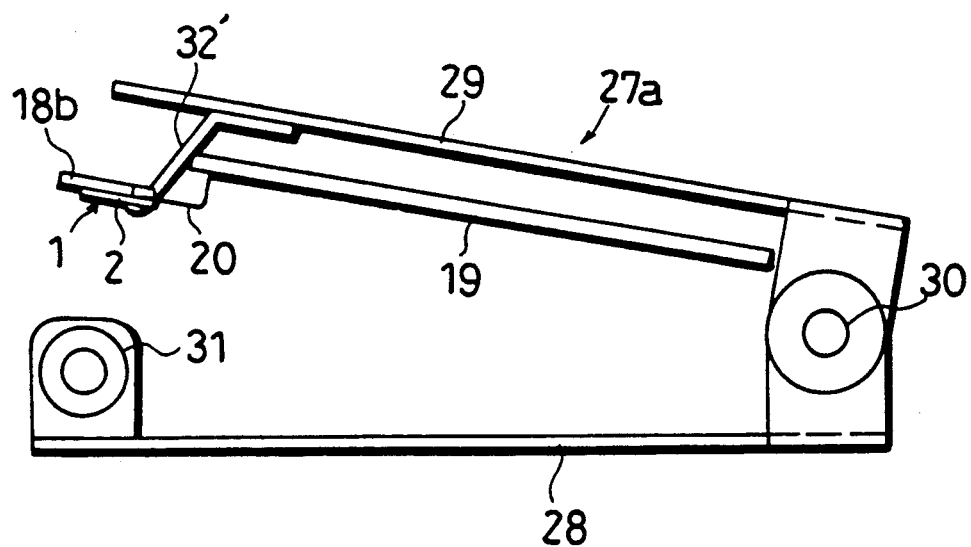
FIG. 11 is a schematic side view showing another printer according to the present invention.

FIG. 11 shows another printer 27a which also comprises a main body 28 and a pivotal member 29 connected to the main body 28 by a hinge device 30. However, the main body 28 of this printer is made to fixedly support a platen 31, whereas the pivotal member 29 is made to support a head substrate 2 and a control circuit board 19.

Specifically, the head substrate 2 shown in FIG. 11 is mounted on a support plate 18b which is, in turn, mounted to the pivotal member 29 by means of leaf springs 32'. The substrate 2 is connected to the respective clip ends of short clip-type leads 20, and the other ends of the respective leads 20 are soldered to the control circuit board 19, thereby establishing electrical connection between the substrate 2 and the control circuit board 19.

In the embodiment of FIG. 11, the support plate 18b is preferably made of a metallic plate which is elastically deformable. Combined with the elasticity of the leaf springs 32', the elastically deformable support plate 18b can be brought into uniform contact with the platen 31 over the entire length thereof when the pivotal member 29 is pivoted to the closed position. Thus, even if the surface flatness of the support plate 18b is not strictly realized, it is possible to ensure a good printing quality.

Figure 12:
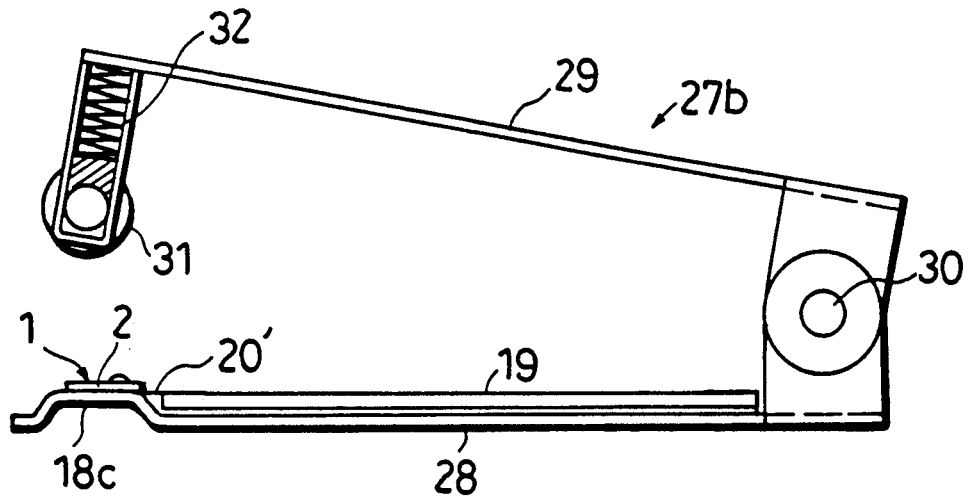
FIG. 12 is a schematic side view showing a furthter printer according to the present invention.

FIG. 12 shows a further printer 27b which differs from the printer 27 of FIG. 9 only in two points. First, the main body 28 of the printer 27b has a front end which bulges upward to provide a support plate 18c. Secondly, electrical connection between the head substrate 2 and the control circuit board 19 is established by short non-clip type leads 20' each of which has both ends welded to the substrate 2 and the control circuit board 19. Obviously, the printer 27b of this embodiment is advantageous in that the thickness of the thermal head 1 can be rendered very small.

Figure 13:
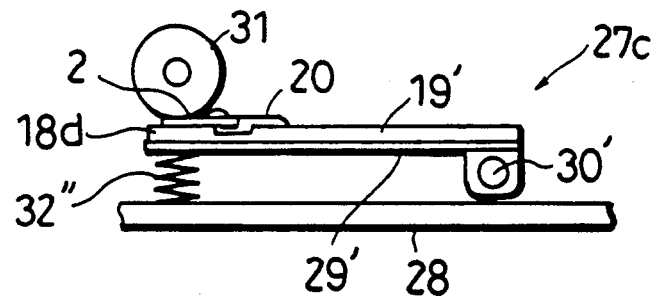
FIG. 13 is a schematic fragmentary side view showing still another printer according to the present invention.

FIG. 13 shows still another printer 27c which comprises a main body 28 (only partially shown) to which a pivotal member 29' is connected by means of a hinge device 30'. The pivotal member 29' supports a control circuit board 19' which has an integral extension 18d to work as a support plate for carrying a head substrate 2. Electrical connection between the control circuit board 19' and the substrate 2 is established by short clip-type leads in the same manner as already described. A platen 31 is supported by the main body 28 above the substrate 2, and the pivotal member 29' is urged upward by compression springs 32" to bring the substrate in intimate pressing contact with the platen 31.

Obviously, the printer 27c of FIG. 13 is advantageous in that the control circuit board 19' has an additional function of supporting the head substrate 2, thereby reducing the total number of components and simplifying the printer structure.

Figure 14:
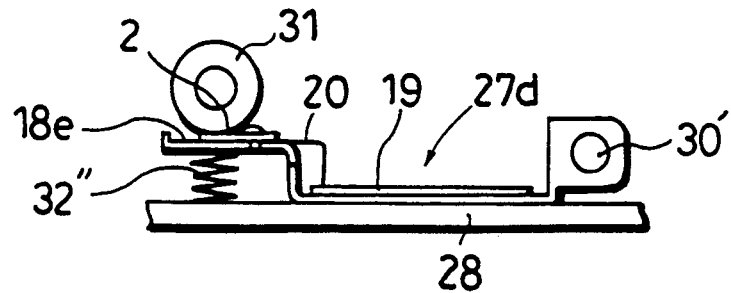
FIG. 14 is a schematic fragmentary side view showing a further printer according to the present invention.

FIG. 14 shows a further printer 27d wherein a support plate 18e for a head substrate 2 is pivotally connected to a main body 28 by means of a hinge device 30'. Thus, the support plate 18e itself functions as a pivotal member. Further, the support plate 18e has a stepped structure and also supports a control circuit board 19. The printer 27d of FIG. 14 is otherwise similar to that of FIG. 13.

FIGS. 15-19 shows a modified thermal printing head according to the present invention.

Similarly to the embodiment shown in FIGS. 1-4, the modified thermal head 1' of FIGS. 15-19 includes an elongate head substrate 2 having a first longitudinal edge 2a and a second longitudinal edge 2b. The upper surface of the substrate 2 is formed with a heating resistor line 3 extending longitudinally of the substrate along the first longitudinal edge 2a, and an array of drive IC's 4' also extending longitudinally of the substrate along the second longitudinal edge 2b. The array of drive IC's 4' is enclosed in a protective resin body PRB.

The upper surface of the head substrate 2 is also formed with two groups of connection terminals 5' arranged in respective end portions of the substrate adjacent to the second longitudinal edge 2b. The upper surface of the head substrate is further formed with a common electrode 6 extending longitudinally of the substrate between the first longitudinal edge 2a and the resistor line 3. Each end 6a of the common electrode 6 extends transversely toward the second longitudinal edge 2b to provide a connection terminal in the corresponding terminal group.

Figure 15:
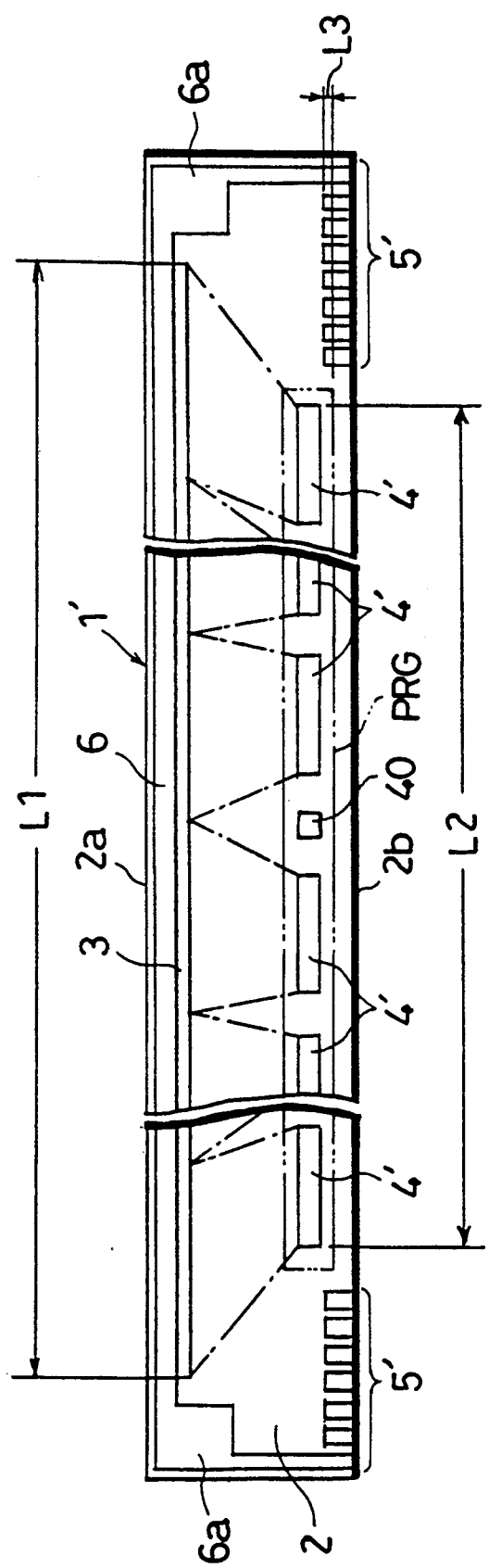
FIG. 15 is a schematic plan view showing another printing head embodying the present invention.

Similarly to the embodiment of FIGS. 1-4, the heating resistor line 3 has a length L1, and the array of drive IC's 4' is intentionally arranged in a smaller length L2, as shown in FIG. 15. The respective groups of connection terminals 5' are arranged locally in the respective excess end portions provided by such an arrangement. Thus, the respective groups of connection terminals 5' are located clear of the drive IC array longitudinally of the substrate 2 but overlap the protective resin body PRB transversely of the head substrate 2 by an amount L3.

On the other hand, the arrangement of the drive IC's 4' within the array is such that a wider spacing is provided between two central drive IC's, as clearly illustrated in FIG. 15. This wider spacing is utilized for mounting a single thermistor 40 at the longitudinal center of the substrate 2. Such a central arrangement of the thermistor 40 is preferred for insuring an accurate temperature detection because heat dissipation tends to be higher at the respective end portions of the substrate 2.

Figure 17:
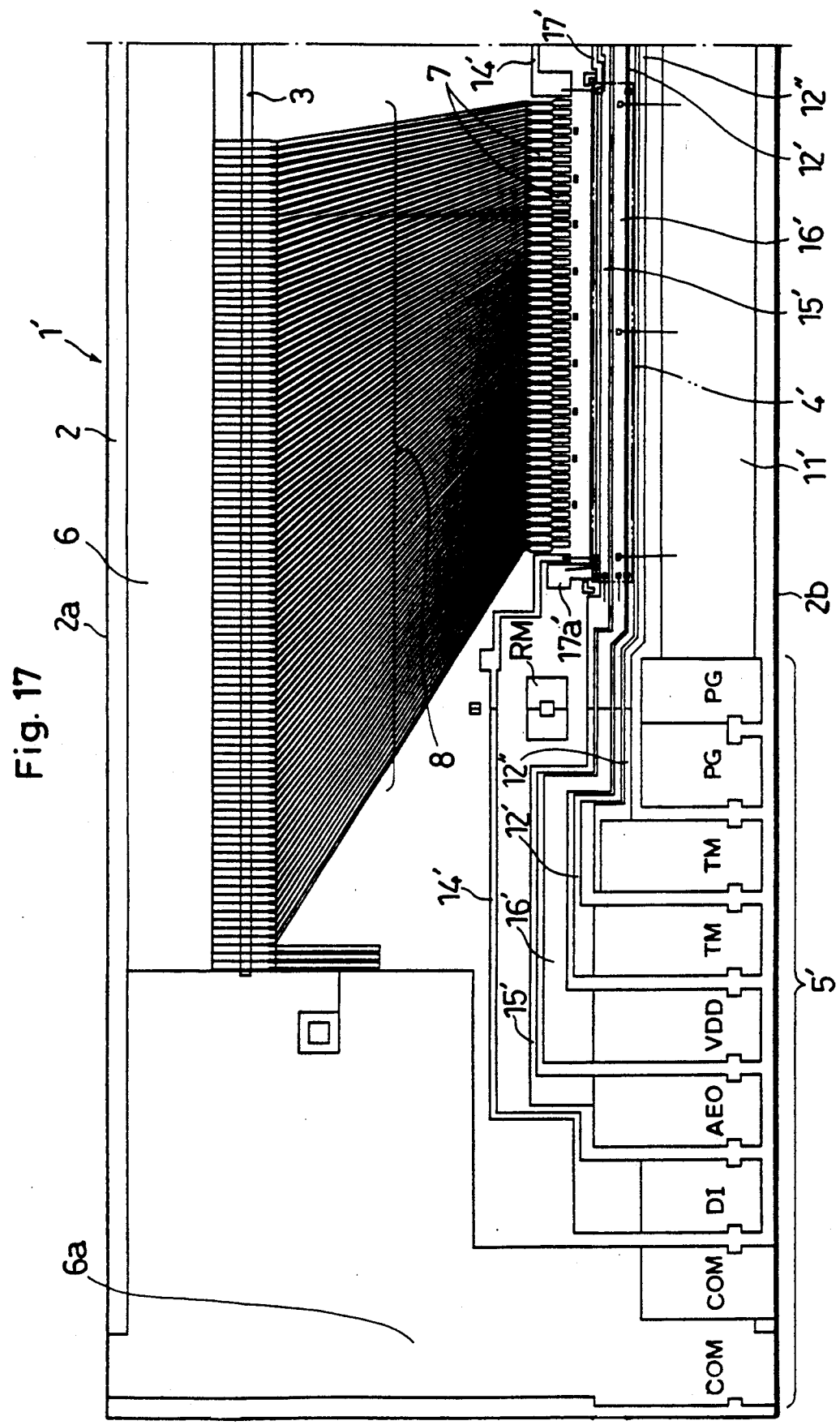
FIG. 17 is a fragmentary plan view showing a left-hand end portion of the printing head shown in FIG. 15.
Figure 18:
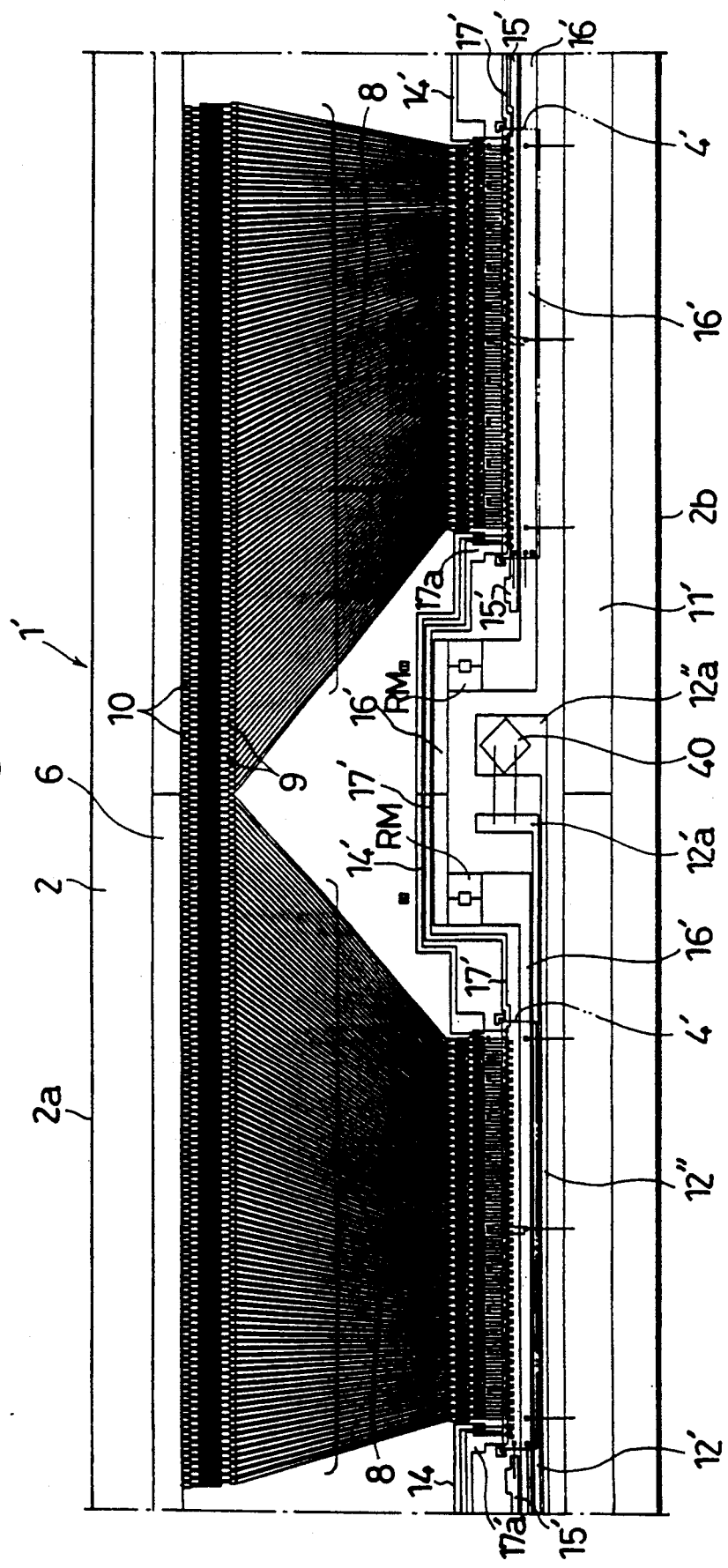
FIG. 18 is a fragmentary plan view showing a central portion of the same head.
Figure 19:
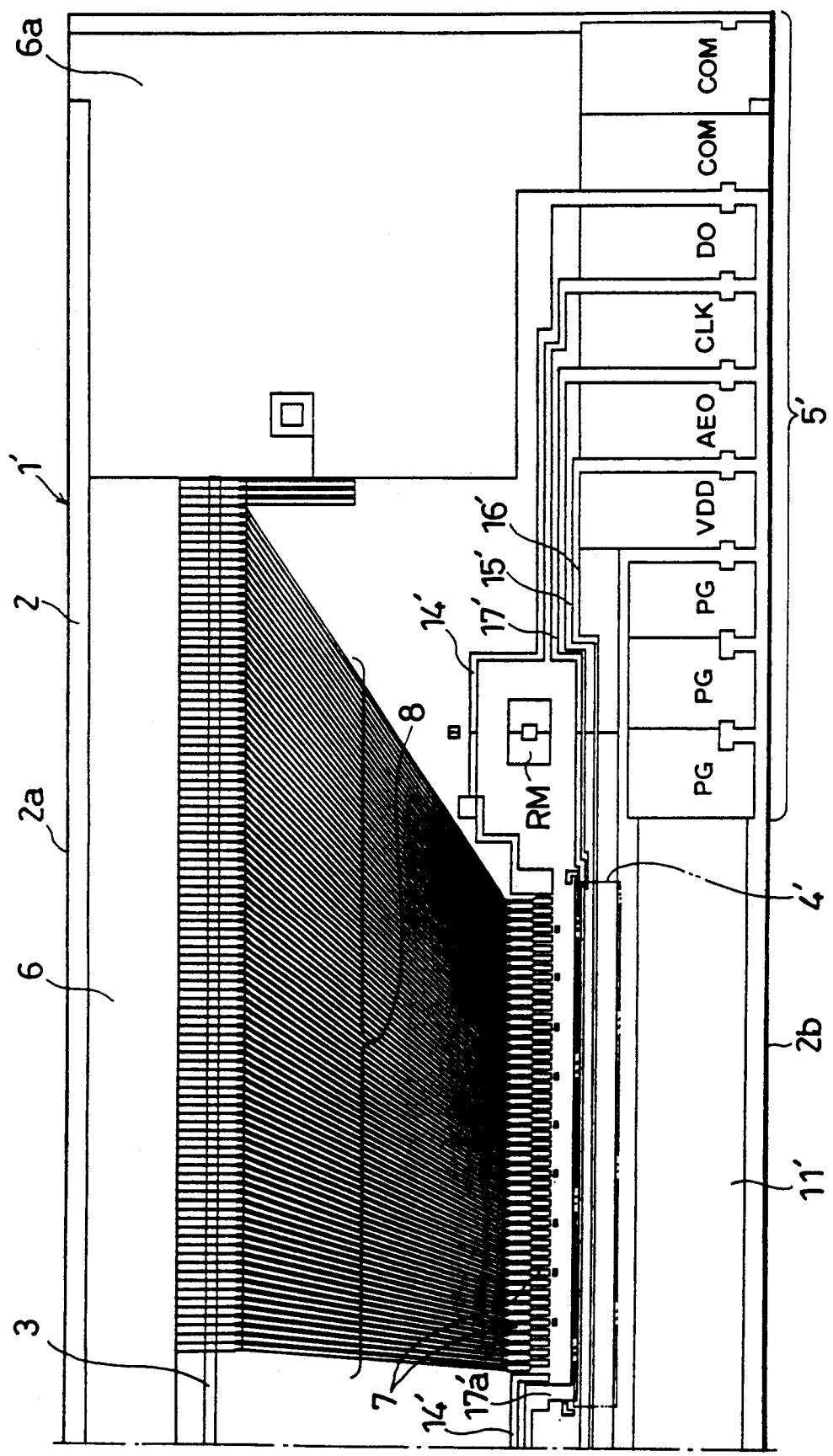
FIG. 19 is a fragmentary plan view showing a right-hand end portion of the same head.

As shown in FIGS. 17-19, groups of wire bonding pads 7 are formed on the upper surface of the head substrate 2 adjacent to the respective drive IC's 4' on the side thereof closer to the first longitudinal edge 2a. A multiplicity of individual electrodes 8 extend, in a slightly flaring pattern, from the respective groups of wire bonding pads 7 to a first series of comb-like teeth 9 crossing the heating resistor line 3. A second series of comb-like teeth 10, which also cross the resistor line 3, are arranged in staggered relation to the first series of comb-like teeth 9 and connected to the common electrode 6. Thus, the heating dots are provided by the respective portions of the resistor line 3 between the two kinds of comb-like teeth 9, 10.

As shown in FIG. 17, the group of connection terminals 5' located in the left-hand end portion of the head substrate 2 include, from left to right, two common terminals COM, a data-in terminal DI, a strobe terminal AEO, a logic power supply terminal VDD, two thermistor connection terminals TM, and two power grounding terminals PG. The common terminals COM and the power grounding terminals PG are plural for enabling passage of a sufficient current.

As shown in FIG. 19, the group of connection terminals 5' located in the right-hand end portion of the head substrate 2 include, from right to left, two common terminals COM, a data-out terminal DO, a clock terminal CLK, a strobe terminal AEO, a logic power supply terminal VDD and three power grounding terminals PG.

As previously described in connection with the embodiment of FIGS. 1-4, the data-out terminal DO may be omitted. Further, depending on various requirements, the number of common terminals COM and power grounding terminals PG may be increased or decreased, and other control signal terminals may be added.

The common terminals COM merge with the respective end portions 6a of the common electrode 6. The power grounding terminals PG are connected to a power grounding conductor path 11' which extends straight between the second longitudinal edge 2b of the head substrate 2 and the drive IC array 4'. In this embodiment, the power grounding conductor path 11' is made relatively wide to assume a major space of the strip-like portion between the second longitudinal edge 2b and the drive IC array 4' for enabling passage of a relatively large current.

One of the thermistor connection terminals TM is connected to a first thermistor conductor path 12' extending substantially straight under the drive IC array 4'. The first thermistor conductor path 12' terminates in a wire bonding pad 12a' (FIG. 18) which is located at the longitudinal center of the substrate 2.

The other thermistor connection terminal TM is connected to a second thermistor conductor path 12" extending substantially straight between the drive IC array 4' and the power grounding path 11'. The second thermistor conductor path 12" terminates in a thermistor mounting pad 12a" (FIG. 18) located also at the longitudinal center of the substrate 2. The thermistor 40 is mounted on the thermistor mounting pad 12a" of the second thermistor conductor path 12" and connected to the wire bonding pad 12a' of the first thermistor conductor path 12' by wire-bonding.

Each strobe terminal AEO is connected to a strobe conductor path 15' extending substantially straight under the drive IC array 4'. However, the strobe conductor path 15' is rendered discontinuous generally at the longitudinal center of the substrate 2, as shown in FIG. 18. Thus, the left half of the strobe conductor path 15' is used only for those of the drive IC's 4' located in the left half of the substrate, whereas the right half of the strobe conductor path 15' is used only for the remaining ones of the drive IC's 4' located in the right half of the substrate.

Each logic power supply terminal VDD is connected to a logic power supply conductor path 16' which also extends substantially straight under the drive IC array 4'. However, this conductor path 16' is formed in a bent pattern at the longitudinal center of the substrate 2 for circumventing the thermistor 40.

The single clock terminal CLK (FIG. 19) located in the right-hand end portion of the head substrate 2 is connected to a clock conductor path 17' which extends longitudinally of the substrate 2 under the respective drive IC's 4' and terminates at the left-hand end drive IC (FIG. 17). The clock conductor path 17' is substantially straight under each of the drive IC's 4' but bent transversely at suitable positions to provide wire bonding portions 17a'.

The data-in terminal DI (FIG. 17) and the data-out terminal DO (FIG. 19) are equally connected to a data conductor path 14' which is formed in a bent pattern to circumvent the other conductor paths. The data conductor path 14' is rendered discontinuous at the positions of the respective drive IC's 4'. Instead, the data conductor path 14' is connected in series or cascade with the respective drive IC's 4', as is the case with the embodiment of FIGS. 1–4.

Figure 16:
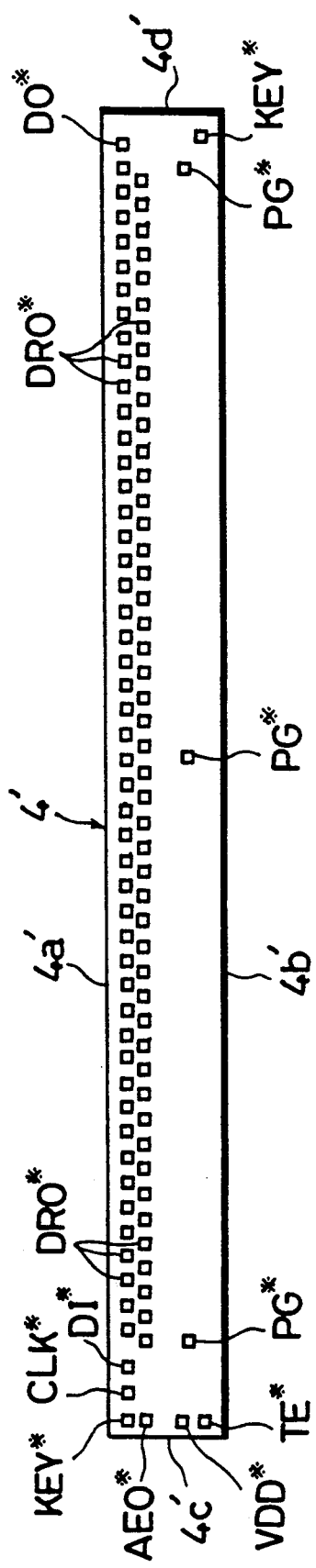
FIG. 16 is a plan view showing a preferred drive IC to be incorporated in the printing head of FIG. 15.

As represented in FIG. 16, each drive IC 4' is rectangular with first and second longer sides 4a', 4b', and first and second shorter sides 4c', 4d'. The drive IC has a multiplicity of drive output pads DRO* arranged in two rows adjacent to the first longer side 4a'. These drive output pads are connected to the wire bonding pads 7 of the corresponding individual electrodes 8 by wire-bonding, as shown in FIG. 18.

As also illustrated in FIG. 16, each drive IC has additional pads which include three power grounding pads PG*, a data-in pad DI*, a data-out pad DO*, a strobe pad AEO*, a logic power supply pad VDD*, a clock pad CLK*, two positioning pads KEY*, and a test pad TE*. The details of these additional pads are described below.

The three power grounding pads PG* are located along and adjacent to the second longer side 4b' of the drive IC 4'. These power grounding pads are wire-bonded to the power grounding conductor path 11' (FIGS. 17–19). It should be appreciated that the power grounding pads PG* may be provided in an optional number as long as they are located adjacent to the second longer side 4b' of the drive IC 4' for conveniently wire-bonding to the power grounding conductor path 11' which is located between the drive IC array and the second longitudinal edge 2b of the head substrate 2.

The data-in pad DI* is located adjacent to the first longer side 4a' and first shorter side 4c' of the drive IC 4', whereas the data-out pad DO* is located adjacent to the first longer side 4a' and second shorter side 4d' of the drive IC. The data-in and data-out pads DI*, DO* are wire-bonded to the discontinuous data conductor path 14' to realize cascade connection between the respective drive IC's (FIGS. 17–19).

The strobe pad AEO* is located adjacent to the first shorter side 4c' of the drive IC 4'. Such a location is selected for conveniently wire-bonding, in the longitudinal direction of the drive IC, to the strobe conductor path 15' which is made to extend under the drive IC. Of course, the strobe pad AEO* may be alternatively located adjacent to the second shorter side 4d' of the drive IC.

The logic power supply pad VDD* is also located adjacent to the first shorter side 4c' of the drive IC 4' for conveniently wire-bonding, again in the longitudinal direction of the drive IC, to the logic power supply conductor path 16' which is made to extend under the drive IC. Of course, the power supply pad VDD* may be alternatively located adjacent to the second shorter side 4d' of the drive IC.

One of the positioning pads KEY* is located adjacent to the first longer side 4a' and first shorter side 4c' of the drive IC 4, whereas the other positioning pad is located adjacent to the second longer side 4b' and second shorter side 4d' of the drive IC. These positioning pads are used only for accurately mounting the drive IC relative to predetermined reference marks RM (FIGS. 17–19) on the head substrate 2, so that they are not wire-bonded to any conductor path. Further, the positioning pads may be omitted because positional adjustment of the drive IC may be performed by utilizing selected corners of the drive IC. It should be appreciated that the positioning pads are shown only in FIGS. 17 and 19 but not in FIG. 18 for the convenience of illustration.

The test pad TE* is located adjacent to the second longer side 4b' and first shorter side 4c' of the drive IC 4'. This test pad is used only for checking the performance of the drive IC before actual mounting. Thus, the test pad is not wire-bonded to any conductor path, and the position of the test pad is not at all important. If necessary, the test pad may be omitted because it has no direct relation with the operation of the drive IC.

Apparently, the respective positions of the data-in pad DI* and data-out pad DO* may be exchanged if the respective positions of the data-in terminal DI and data-out terminal DO are also exchanged. Similarly, the respective positions of the strobe pad AEO*, logic power supply pad VDD* and clock pad CLK* (plus the positioning pads KEY* and test pad TE* as well) may be also exchanged if the relevant conductor paths 15'–17' together with the relevant connection terminals AEO, VDD, CLK are suitably rearranged. An important point resides in that the control signal pads including DI*, DO*, AEO*, VDD* and CLK* for example are located adjacent to one or both of the shorter sides 4c', 4d' of the drive IC 4'.

According to the embodiment of FIGS. 15–19, the connection terminals 5' are arranged in the respective excess end portions of the head substrate 2, and the conductor paths 11', 15'–17' are connected commonly to the respective drive IC's 4'. Thus, the modified thermal head 1' has the same advantages as already described in connection with the embodiment of FIGS. 1–4. Further, the modified thermal head 1' has the following additional advantages.

First, since each drive IC 4' has its control signal pads DI*, DO*, AEO*, VDD* and CLK* located adjacent to the respective shorter sides 4c', 4d', the relevant conductor paths 14'–17' can be formed to extend under the drive IC and/or near the first longer side 4a' of the drive IC. In other words, the conductor paths 14'-17' associated with these control signal pads DI*, DO*, AEO*, VDD* and CLK* need not be necessarily formed in the strip-like portion between the drive IC array and the second longitudinal edge 2b of the substrate 2. Thus, the majority of that strip-like portion (even if rendered narrow) can be utilized for forming the power grounding conductor path 11' with a sufficient width (as required for passing a relatively large current) while also reducing the overall width of the thermal head 1'.

Secondly, due to the above-described arrangement of the control signal pads DI*, DO*, AEO*, VDD* and CLK*, the relevant conductor paths 14'-17' together with the power grounding path 11' can be made to extend as straight as possible. As a result, patterning of these conductor paths is greatly simplified to increase the productivity and yield. Further, due to the reduction of bending and/or branching portions, the conductor paths can be as short as possible to decrease the voltage drop and noises.

The present invention being thus described, it is obvious that the same may be varied in many ways. Such variations are not to be regarded as a departure from the spirit and scope of the the invention, and all such modifications as would be obvious to those skilled in the art are intended to be included within the scope of the following claims.

We claim:

1. A printing head comprising:
   an elongate head substrate having first and second longitudinal edges;
   a line of printing dots provided on the head substrate along the first longitudinal edge;
   an array of drive ICs provided on the head substrate along the second longitudinal edge and enclosed in a protective resin body;
   a plurality of connection terminals formed on the head substrate adjacent to the second longitudinal edge; and
   a pattern of wiring conductor paths formed on the head substrate for electrically connecting between the connection terminals and the drive ICs;
   wherein the drive IC array is rendered shorter than the printing dot line to provide two excess portions at both ends of the head substrate, the connection terminals being locally arranged within the respective excess end portions without overlapping the drive IC array longitudinally of the head substrate while overlapping the protective resin body transversely of the head substrate.

2. The printing head according to claim 1, wherein the printing dots are divided into groups corresponding to the respective drive ICs, at least two end drive ICs located closest to the respective ends of the head substrate being offset toward a center of the head substrate relative to corresponding two end groups of printing dots located closest to the respective ends of the head substrate.

3. The printing head according to claim 1, wherein a part of the wiring conductor paths is arranged in a strip-like portion of the head substrate between the drive IC array and the second longitudinal edge of the head substrate.

4. The printing head according to claim 3, wherein the wiring conductor paths include a power grounding path extending substantially straight in the strip-like portion of the head substrate.

5. The printing head according to claim 1, wherein selected ones of the wiring conductor paths are connected commonly to all of the drive ICs.

6. The printing head according to claim 1, wherein each of the drive ICs is rectangular with first and second longer sides as well as first and second shorter sides; said each drive IC having a multiplicity of drive output pads arranged adjacent to and along the first longer side of said each drive IC; said each drive IC further having control signal pads which include at least a data-in pad, a data-out pad, a strobe pad, a logic power supply pad and a clock pad; the control signal pads being arranged adjacent to the respective shorter sides of said each drive IC.

7. The printing head according to claim 6, wherein selected ones of the wiring conductor paths are made to extend substantially straight longitudinally under said each drive IC.

8. The printing head according to claim 7, wherein at least one of the control signal pads of said each drive IC is wire-bonded to a corresponding one of the wiring conductor paths in a longitudinal direction of said each drive IC.

9. The printing head according to claim 6, wherein said each drive IC further has a plurality of power grounding pads arranged adjacent to the second longer side of said each drive IC, the wiring conductor paths including a power grounding conductor path which extends substantially straight in a strip-like portion of the head substrate between the drive IC array and the second longitudinal edge of the head substrate, the power grounding pads of said each drive IC being wire-bonded to the power grounding conductor path.

10. A printer comprising a printing head and a control circuit board; the printing head comprising:
    an elongate head substrate having first and second longitudinal edges;
    a line of printing dots provided on the head substrate along the first longitudinal edge;
    an array of drive ICs provided on the head substrate along the second longitudinal edge and enclosed in a protective resin body;
    a plurality of connection terminals formed on the head substrate adjacent to the second longitudinal edge; and
    a pattern of wiring conductor paths formed on the head substrate for electrically connecting between the connection terminals and the drive ICs;
    wherein the drive IC array is rendered shorter than the printing dot line to provide two excess portions at both ends of the head substrate, the connection terminals being locally arranged within the respective excess end portions without overlapping the drive IC array longitudinally of the head substrate while overlapping the protective resin body transversely of the head substrate; and
    wherein the control circuit board is arranged adjacent to the head substrate and provided with connection terminals electrically connected to the connection terminals of the head substrate.

11. The printer according to claim 10, wherein the connection terminals of the head substrate are electrically connected to the connection terminals of the control circuit board by leads which are removably inserted into connector means mounted on the control circuit board.

12. The printer according to claim 10, wherein the connection terminals of the head substrate are electrically connected to the connection terminals of the control circuit board by leads which are held in intimate contact with the connection terminals of the control circuit board by a presser member removably fixed to the control circuit board.

13. The printer according to claim 10, further comprising a printer main body and a pivotal member pivotally connected to the main body, the head substrate together with the control circuit board being fixedly supported by the main body, the head substrate being held in pressing contact with a platen which is supported by the pivotal member and urged toward the head substrate by spring means.

14. The printer according to claim 10, further comprising a printer main body and a pivotal member pivotally connected to the main body, the head substrate together with the control circuit board being supported by the pivotal member, the head substrate being held in pressing contact with a platen which is supported by the main body.

15. The printer according to claim 14, wherein the head substrate is urged toward the platen by spring means.

* * * * *